US011647590B2

(12) United States Patent
Burress et al.

(10) Patent No.: US 11,647,590 B2
(45) Date of Patent: May 9, 2023

(54) SYSTEMS AND METHODS FOR ETCHING OF METALS

(71) Applicant: D-WAVE SYSTEMS INC., Burnaby (CA)

(72) Inventors: Jeffrey P. Burress, Bristow, VA (US); Richard D. Neufeld, Burnaby (CA); Surjit Singh Dhesi, Richmond (CA)

(73) Assignee: D-WAVE SYSTEMS INC., Burnaby (CA)

( * ) Notice: Subject to any disclaimer, the term of this patent is extended or adjusted under 35 U.S.C. 154(b) by 185 days.

(21) Appl. No.: 16/896,554

(22) Filed: Jun. 9, 2020

(65) Prior Publication Data
US 2020/0404792 A1 Dec. 24, 2020

Related U.S. Application Data

(60) Provisional application No. 62/863,028, filed on Jun. 18, 2019.

(51) Int. Cl.
*H05K 3/06* (2006.01)
*H01L 39/24* (2006.01)

(52) U.S. Cl.
CPC ............. *H05K 3/067* (2013.01); *H01L 39/24* (2013.01); *H05K 3/064* (2013.01)

(58) Field of Classification Search
CPC ................... H05K 3/067; H05K 3/064; H05K 2201/0338; H05K 1/09; H01L 39/24
USPC ......................................................... 216/13
See application file for complete search history.

(56) References Cited

U.S. PATENT DOCUMENTS

| 3,343,979 | A | 9/1967 | Hamrin |
| 3,859,149 | A | 1/1975 | Kay |
| 4,141,850 | A | 2/1979 | Readio et al. |
| 4,144,119 | A | 3/1979 | Dutkewych et al. |
| 4,437,931 | A | 3/1984 | Elias et al. |
| 4,466,859 | A | 8/1984 | Nelson |

(Continued)

FOREIGN PATENT DOCUMENTS

| CN | 85101736 A | * | 1/1987 | ................ C23F 1/18 |
| CN | 1140008 A |   | 1/1997 |

(Continued)

OTHER PUBLICATIONS

PubChem, Sodium 4-hydroxybenzenesulfonate (Year: 2005).*

(Continued)

*Primary Examiner* — Duy Vu N Deo
(74) *Attorney, Agent, or Firm* — Cozen O'Connor

(57) ABSTRACT

A method of fabricating a multilayer superconducting printed circuit board comprises first, forming a bimetal foil to overlie a substrate, the bimetal foil comprising a first layer of a first metal, a layer of a second metal, and a second layer of the first metal, and then etching the second layer of the first metal. Forming a bimetal foil to overlie a substrate may include forming a bimetal foil comprising a first layer of a normal metal, a layer of a superconducting metal, and a second layer of the normal metal. Etching the second layer of the first metal may include preparing a patterned image in the second layer of the first metal for etching, processing the patterned image through a cleaner, rinsing the patterned image, and then, immersing the patterned image in a micro-etch.

20 Claims, 7 Drawing Sheets

(56) References Cited

U.S. PATENT DOCUMENTS

| | | | |
|---|---|---|---|
| 4,632,727 A | 12/1986 | Nelson | |
| 4,660,061 A | 4/1987 | Sweeny et al. | |
| 4,849,124 A | 7/1989 | Backus | |
| 4,915,781 A | 4/1990 | Bohnen et al. | |
| 4,954,480 A | 9/1990 | Imanaka et al. | |
| 4,956,035 A | 9/1990 | Sedlak | |
| 5,106,454 A | 4/1992 | Allardyce et al. | |
| 5,430,012 A | 7/1995 | Nakamura et al. | |
| 5,440,239 A | 8/1995 | Zappella et al. | |
| 5,492,595 A | 2/1996 | Carano et al. | |
| 5,532,094 A | 7/1996 | Arimura et al. | |
| 5,538,152 A | 7/1996 | Fontana | |
| 5,800,859 A | 9/1998 | Price et al. | |
| 6,086,779 A | 7/2000 | Bishop et al. | |
| 6,184,477 B1 | 2/2001 | Tanahashi | |
| 6,444,140 B2 | 9/2002 | Schemenaur et al. | |
| 6,678,540 B2 | 1/2004 | Wire et al. | |
| 6,746,621 B2 | 6/2004 | Kurii et al. | |
| 6,747,217 B1 | 6/2004 | Jochym et al. | |
| 6,852,926 B2 | 2/2005 | Ma et al. | |
| 7,135,701 B2 | 11/2006 | Amin et al. | |
| 7,148,483 B1 | 12/2006 | Testardi | |
| 7,533,068 B2 | 5/2009 | Maassen et al. | |
| 7,687,938 B2 | 3/2010 | Bunyk et al. | |
| 7,932,515 B2 | 4/2011 | Bunyk | |
| 8,008,942 B2 | 8/2011 | Van et al. | |
| 8,018,244 B2 | 9/2011 | Berkley | |
| 8,190,548 B2 | 5/2012 | Choi | |
| 8,195,596 B2 | 6/2012 | Rose et al. | |
| 8,441,329 B2 | 5/2013 | Thom et al. | |
| 8,481,472 B2 | 7/2013 | Westwood et al. | |
| 8,649,834 B1 | 2/2014 | Jones | |
| 8,772,759 B2 | 7/2014 | Bunyk et al. | |
| 9,175,404 B2 | 11/2015 | Kojima et al. | |
| 2006/0147154 A1 | 7/2006 | Thom et al. | |
| 2006/0225165 A1 | 10/2006 | Maassen et al. | |
| 2008/0286989 A1 | 11/2008 | Strauss | |
| 2009/0008632 A1 | 1/2009 | Bunyk et al. | |
| 2009/0099025 A1 | 4/2009 | Uchaykin | |
| 2009/0173936 A1 | 7/2009 | Bunyk | |
| 2010/0052024 A1 | 3/2010 | Kiyomura et al. | |
| 2011/0022820 A1 | 1/2011 | Bunyk et al. | |
| 2012/0007230 A1 | 1/2012 | Hwang et al. | |
| 2012/0068334 A1 | 3/2012 | Migita et al. | |
| 2013/0234909 A1 | 9/2013 | Koh et al. | |
| 2015/0119252 A1 | 4/2015 | Ladizinsky et al. | |
| 2016/0348245 A1 | 12/2016 | Jin et al. | |

FOREIGN PATENT DOCUMENTS

| | | | | |
|---|---|---|---|---|
| CN | 103918357 A | 7/2014 | | |
| EP | 0150512 A2 | 8/1985 | | |
| EP | 0164757 A2 | 12/1985 | | |
| EP | 2225175 A1 | 9/2010 | | |
| TW | 200952589 A | 12/2009 | | |
| TW | 201734264 A | * 10/2017 | ............... | C23F 1/02 |
| WO | 2010039936 A2 | 4/2010 | | |
| WO | 2017155531 A1 | 9/2017 | | |
| WO | 2018106942 A1 | 6/2018 | | |
| WO | WO 2018/106942 A1 | * 6/2018 | ............... | H04K 3/42 |

OTHER PUBLICATIONS

Amin, "Effect of Local Minima on Adiabatic Quantum Optimization," Physical Review Letters 100(130503), 2008, 4 pages.
Ardavan et al., "Nanoscale solid-state quantum computing", Philosophical Transactions of the Royal Society of London, Jun. 11, 2003.
Blatter et al., "Design aspects of superconducting-phase quantum bits," Physical Review B 63: 174511-1-174511-9, 2001.
Chinese Office Action dated Jan. 5, 2022 for Chinese Application No. 201780076119.9 in 10 pages (translation of action).
F. Pobell, "Matter and Methods at Low Temperatures", Springer-Verlag, 2nd Edition, 1996.
Farhi et al., "Quantum Adiabatic Evolution Algorithms versus Simulated Annealing," MIT-CTP #3228, arXiv:quant-ph/0201031 v1, pp. 1-16, Jan. 8, 2002.
Feynman, "Simulating Physics with Computers," International Journal of Theoretical Physics 21(6/7): 467-488, 1982.
Friedman et al., "Quantum superposition of distinct macroscopic states," Nature 406:43-46, Jul. 6, 2000.
Il'ichev et al., "Continuous Monitoring of Rabi Oscillations in a Josephson Flux Qubit," Physical Review Letters 91(9): 097906-1-097906-4, week ending Aug. 29, 2003.
International Search Report and Written Opinion dated Apr. 5, 2018, for PCT/US2017/065152 in 10 pages.
Krenner et al., "Recent advances in exciton-based quantum information processing in quantum dot nanostructures", New Journal of Physics, Aug. 26, 2005.
Maasen van den Brink et al., "Mediated Tunable Coupling of Flux Qubits," New Journal of Physics 7(230) 2005, 19 pages.
Makhlin et al., "Quantum-state engineering with Josephson-junction devices," Reviews of Modern Physics 73(2):357-400, Apr. 2001.
Mooij et al., "Josephson Persistent-Current Qubit," Science 285:1036-1039, Aug. 13, 1999.
Nielsen et al., Quantum Computation and Quantum Information, Cambridge University Press, Cambridge, 2000, "7.8 Other implementation schemes," pp. 343-345.
Orlando et al., "Superconducting persistent-current qubit," Physical Review B 60(22):15398-15413, Dec. 1, 1999.
Shor, "Introduction to Quantum Algorithms," AT&T Labs—Research, arXiv:quant-ph/0005003 v2, pp. 1-17, Jul. 6, 2001.
T. Miyazaki, S. Yorozu, M. Maezawam M. Hidaka, J-S Tsai, "Development of SFQ Multi-Chip Modules for Quantum Bits", IEEE Transactions on Applied Superconductivity, Jun. 2007.
T. Ogashiwa et al., "Flip-Chip Bonding Using Superconducting Solder Bump", Jpn. J. Appl. Phys., Aug. 1995.
T. P. Spiller, I. D'Amico & B. W. Lovett, "Entanglement distribution for a practical quantum-dot-based quantum processor architecture", New Journal of Physics, Jan. 29, 2007.
Yokoyama et al., "Robust Superconducting Die Attach Process", IEEE Transactions on Applied Superconductivity, Jun. 1997.
Non Final Office Action for U.S. Appl. No. 16/465,765, dated Jun. 28, 2022, 7 pages.
"Detailed Procedures of Plating Copper for PCB Processing", PCBWay, Sep. 14, 2018, 6 pages.
"Thetawet TM Fs-8150" Short-Chain Telomer-based Fluorosurfactant, Technical Data Sheet, Innovative Chemical Technologies, Inc., US EPA 2010/2015—2 pages.
Feng, et al., "Cupric Chloride-HCl Acid Microetch Roughening Process", PCB Fabriction, OnBoard Technology Sep. 2008—4 pages.
Tang, et al., "Advance Surfactant-Modified Wet Anisotropic Etching", ResearchGate, Nagoya University Japan, Chapter—Dec. 2011, 25 pages.

* cited by examiner

SYSTEMS AND METHODS FOR ETCHING OF METALS

FIELD

The present systems, methods, and apparatus pertain generally to the etching of metals, and more particularly to the etching of copper in the manufacture of printed circuit boards.

BACKGROUND

Etching of Metals

The etching of metals can be used in a variety of industrial and non-industrial processes. In some processes, the etching of metals is used for cleaning surfaces (for example, metal surfaces). In some processes, the etching of metals is used to produce a desired pattern on a metal surface. Etching is also referred to in the present application as photo-chemical machining, photo-fabrication, photo-etching and chemical milling.

In some implementations, a photoresist is used to describe a photographic design on the surface of a metal substrate. The photographic design is also referred to in the present application as a pattern or an image.

The photoresist is a photo-sensitive material that can be used to transfer a pattern to the surface of the metal substrate by ultraviolet (UV) lithography. The process can include forming a coating of photoresist on the metal substrate. When exposed to UV light, a photochemical reaction can occur in exposed regions of the photoresist. A pattern in the photoresist can be formed by dissolving unexposed regions of the photoresist in a suitable solution (for example, a developer solution). Chemical etching can selectively dissolve the metal substrate in areas unprotected by the photoresist, leaving a precise reproduction of the original photographic design.

Example Application to Printed Circuit Boards

An example of the application of etching metals to provide a desired pattern on a metal surface is in the production of printed circuits (also referred to in the present application as printed circuit boards). Production of printed circuit boards (PCBs) can include etching away a layer of copper on an insulating substrate in predetermined areas, in order to provide a desired pattern of conducting links (also referred to in the present application as traces) on the surface of the insulating substrate. A multi-layer PCB can include one or more conductive vias to provide electrical communication between traces on separate layers of a PCB. PCBs are widely used in electronic products, and can provide a cost-effective and reliable wiring method for electronic circuits.

Quantum Devices

Quantum devices are structures in which quantum mechanical effects are observable. Quantum devices include circuits in which current transport is dominated by quantum mechanical effects. Such devices include spintronics, and superconducting circuits. Both spin and superconductivity are quantum mechanical phenomena. Quantum devices can be used for measurement instruments, in computing machinery, and the like.

Quantum Computation

A quantum computer is a system that makes direct use of at least one quantum-mechanical phenomenon, such as, superposition, tunneling, and entanglement, to perform operations on data. The elements of a quantum computer are qubits. Quantum computers can provide speedup for certain classes of computational problems such as computational problems simulating quantum physics.

A quantum computer may include a quantum processor. A quantum processor may include an integrated circuit. A quantum processor may include a superconducting integrated circuit. A quantum processor may include a superconducting PCB.

Quantum Annealing

A quantum processor may be designed to perform quantum annealing and/or adiabatic quantum computation. Quantum annealing is a computational method that may be used to find a low-energy state of a system, typically preferably the ground state of the system.

Similar in concept to classical simulated annealing, the method relies on the underlying principle that natural systems tend towards lower energy states because lower energy states are more stable. While classical annealing uses classical thermal fluctuations to guide a system to a low-energy state, quantum annealing may use quantum effects, such as quantum tunneling, as a source of delocalization to reach an energy minimum more accurately and/or more quickly than classical annealing.

In some implementations, an evolution Hamiltonian is constructed that is proportional to the sum of a first term proportional to a problem Hamiltonian and a second term proportional to a delocalization Hamiltonian, as follows:

$$H_E \propto A(t)H_P + B(t)H_D$$

where $H_E$ is the evolution Hamiltonian, $H_P$ is the problem Hamiltonian, $H_D$ is the delocalization Hamiltonian, and $A(t)$, $B(t)$ are coefficients that can control the rate of evolution, and typically lie in the range [0,1].

In some implementations, a time-varying envelope function is placed on the problem Hamiltonian. A suitable delocalization Hamiltonian can be expressed as follows:

$$H_D \propto -\frac{1}{2}\sum_{i=1}^{N} \Delta_i \sigma_i^x$$

where N represents the number of qubits, $\sigma_i^x$ of is the Pauli x-matrix for the $i^{th}$ qubit and $\Delta_i$ is the single qubit tunnel splitting induced in the $i^{th}$ qubit. Here, the $\sigma_i^x$ of terms are examples of "off-diagonal" terms.

A common problem Hamiltonian can include a first component proportional to diagonal single qubit terms and a second component proportional to diagonal multi-qubit terms, and may be of the following form:

$$H_P \propto -\frac{\varepsilon}{2}\left[\sum_{i=1}^{N} h_i \sigma_i^z + \sum_{j>i}^{N} J_{ij} \sigma_i^z \sigma_j^z\right]$$

where N represents the number of qubits, $\sigma_i^z$ of is the Pauli z-matrix for the $i^{th}$ qubit, $h_i$ and $J_{ij}$ are dimensionless local fields for the qubits, and couplings between qubits, respectively, and E is some characteristic energy scale for $H_P$.

Here, the $\sigma_i^z$ and $\sigma_i^z \sigma_j^z$ terms are examples of diagonal terms. The former is a single-qubit term, and the latter a two-qubit term.

Throughout this specification, the terms "problem Hamiltonian" and "final Hamiltonian" are used interchangeably unless the context dictates otherwise. Certain states of the quantum processor are energetically preferred, or simply preferred by the problem Hamiltonian. These may include ground states and excited states.

Hamiltonians such as $H_D$ and $H_P$ in the above two equations, respectively, may be physically realized in a variety of different ways. In one example, the Hamiltonians are realized by an implementation of superconducting qubits.

BRIEF SUMMARY

A method of fabricating a multilayer superconducting printed circuit board may be summarized as comprising first, forming a bimetal foil to overlie a substrate, the bimetal foil comprising a first layer of a first metal, a layer of a second metal, and a second layer of the first metal, and then etching the second layer of the first metal.

In some implementations, the forming a bimetal foil to overlie a substrate includes forming a bimetal foil to overlie an electrically insulative substrate. In some implementations, the forming a bimetal foil to overlie an electrically insulative substrate includes the forming a bimetal foil to overlie at least one of a polyimide or a polytetrafluoroethylene (PTFE) composite.

In some implementations, the forming a bimetal foil to overlie a substrate, the bimetal foil comprising a first layer of a first metal, a layer of a second metal, and a second layer of the first metal includes forming a bimetal foil to overlie a substrate, the bimetal foil comprising a first layer of a normal metal, a layer of a superconducting metal, and a second layer of the normal metal.

In some implementations, the forming the bimetal foil to overlie the substrate, the bimetal foil comprising the first layer of the normal metal, the layer of the superconducting metal, and the second layer of the normal metal includes forming the bimetal foil to overlie the substrate, the bimetal foil comprising a first layer of copper, a layer of aluminum, and a second layer of copper. In some implementations, the forming the bimetal foil to overlie the substrate, the bimetal foil comprising the first layer of copper, the layer of aluminum, and the second layer of copper includes at least partially copper-plating the substrate to form a copper-plated substrate, at least partially aluminum-plating the copper-plated substrate to form a superconductive substrate, and at least partially copper-plating the superconductive substrate.

In various of the above implementations, the etching the second layer of the first metal may include preparing a patterned image in the second layer of the first metal for etching, processing the patterned image through a cleaner, rinsing the patterned image, and then, immersing the patterned image in a microetch. The cleaner may include a surfactant. The cleaner may further include de-ionized water and sulfuric acid.

The microetch may include a catalyst and a first stabilizer. The microetch may further include tungsten and 1, 6 hexanediol. The microetch may further include de-ionized water, sulfuric acid, hydrogen peroxide, and sodium hydroxybenzene sulfonate.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not necessarily drawn to scale, and some of these elements are arbitrarily enlarged and positioned to improve drawing legibility. Further, the particular shapes of the elements as drawn are not necessarily intended to convey any information regarding the actual shape of the particular elements, and have been solely selected for ease of recognition in the drawings.

Figure 3A:
Figure 3A:
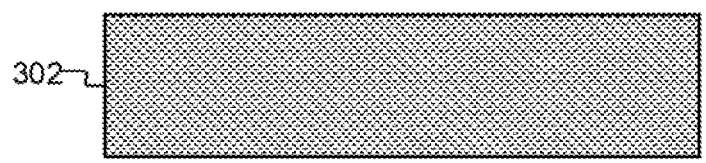
Figure 3B:
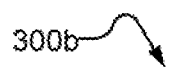
Figure 3B:
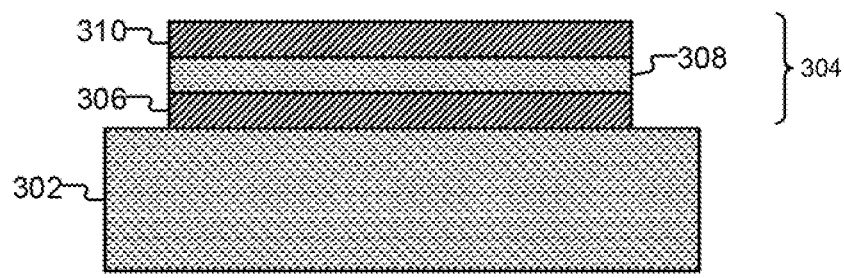
Figure 3C:
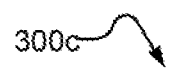
Figure 3C:
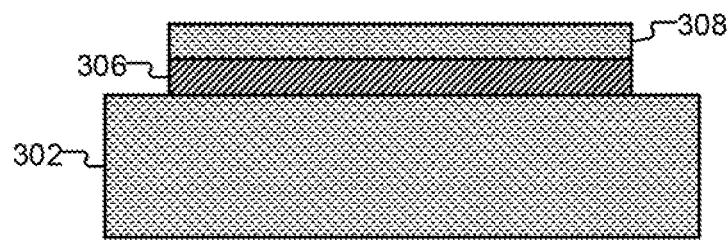

FIGS. 3A, 3B, and 3C are cross-sectional views of an integrated circuit at different stages of a fabrication process, according to one illustrated implementation of the present disclosure.

Figure 4:
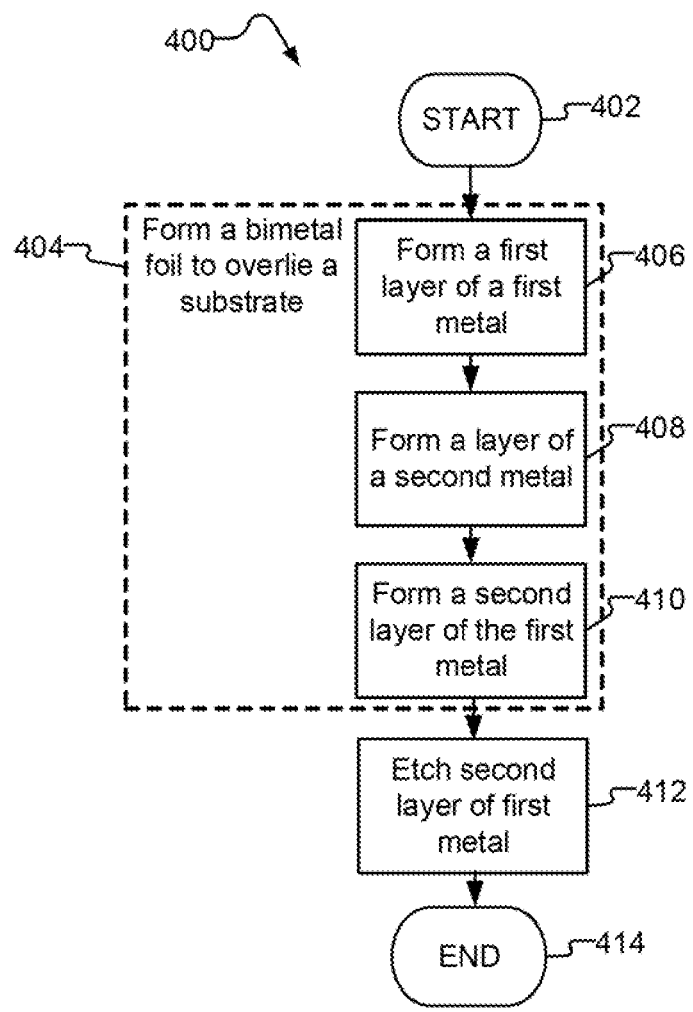

FIG. 4 is a flow chart illustrating an etching process, according to one illustrated implementation of the present disclosure.

Figure 5:
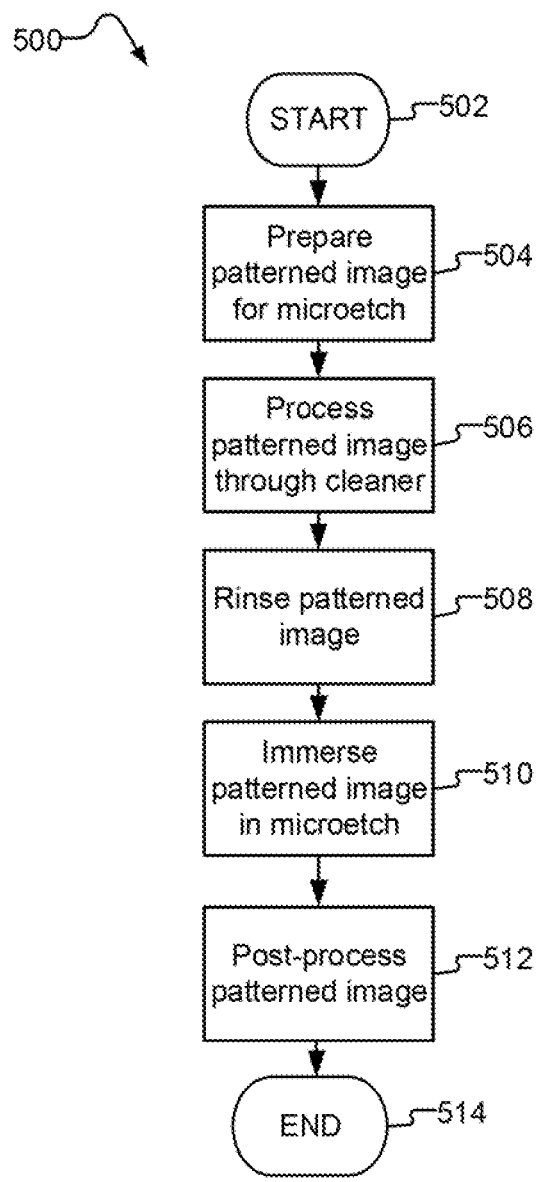

FIG. 5 is a flow chart illustrating a two-stage etching process, according to one illustrated implementation of the present disclosure.

GLOSSARY

Hot air solder leveling: Hot air solder leveling is a type of finish used on printed circuit boards (PCBs). In some implementations, a PCB is dipped into a bath of molten solder so that exposed copper surfaces are covered by solder.

Insulative material: An insulative material (also referred to in the present application as an insulative medium and an insulative substrate) is an electrically insulative substrate which electrically insulates conductive or superconductive current paths from one another (e.g., in a printed circuit board).

Normal metal: Normal metal (also referred to in the present application as a non-superconducting metal) is a conductive material, path or trace that is not superconducting at typical superconducting temperatures.

Printed Circuit Board (PCB): A printed circuit board is an electronic circuit in which at least some of the parts and electrical connections include conductive tracks (also referred to in the present application as traces), pads and other features etched from one or more sheet layers of metal (e.g., copper) laminated onto and/or between sheet layers of a non-conductive substrate.

Substrate: A substrate is a base material (e.g., a non-conductive material or a metal) on which processing is conducted to produce a new film or layer of material such as a deposited coating.

Superconducting: The term superconducting, when used to describe a physical structure (such as a superconducting trace or a superconducting current path on a superconducting printed circuit board), is used to indicate a physical structure that includes material capable of behaving as a superconductor when the physical structure is operated at an appropriate temperature—usually at or below a temperature referred to as a critical temperature. At some times during operation of the physical structure, and/or in some implementations of the present systems and methods, the physical structure may not be superconducting.

Superconducting Material: A superconducting material (such as a metal or metallic alloy) is superconductive in a range of temperatures. A superconductive material is generally superconductive at or below a characteristic temperature also referred to in the present application as a critical temperature. For example, the critical temperature of aluminum is 1.2 K. The critical temperature of tin is 3.7 K. At some times, and/or in some implementations of the present systems and methods, a superconducting material may not be superconducting. Some implementations of the present systems and methods may be operated at a temperature in a range of temperatures at which a constituent superconducting material is superconductive.

Superconducting Metal: A superconducting metal is a metal that is superconducting at typical superconducting temperatures, e.g., at or below a critical temperature.

Superconducting Printed Circuit Board: A superconducting printed circuit board is a PCB in which at least one of the traces or pads on the PCB is superconducting in a range of temperatures.

Via: A via (also known as a VIA or a vertical interconnect access) is an electrical communicative coupling between layers of a physical electronic circuit (e.g. an integrated circuit) that goes through the plane of one or more adjacent layers.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with printed circuit boards, superconducting circuits, devices and control systems including microprocessors and drive circuitry have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one implementation" or "an implementation" or to "one embodiment" or "an embodiment" means that a particular feature, structure or characteristic described in connection with the implementation or embodiment is included in at least one implementation or embodiment. Thus, the appearances of the phrases "one implementation" or "an implementation" or to "in one embodiment" or "in an embodiment" in various places throughout this specification are not necessarily all referring to the same implementation or embodiment. Furthermore, the particular features, structures, or characteristics may be combined in any suitable manner in one or more implementations or embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The headings and Abstract of the Disclosure provided herein are for convenience only and do not interpret the scope or meaning of the embodiments.

Overview of the Technology

The technology described in the present application relates to systems and methods for the etching of metals, and, in particular, to the etching of copper. In some implementations, the copper to be etched has been deposited or otherwise formed to overlie, directly or indirectly, a layer of aluminum. The layer of aluminum may include a patterned layer of aluminum.

Superconducting Electronics

A conventional PCB is typically manufactured using one or more normal metals (also referred to in the present application as normal non-superconducting metals or non-superconducting metals). A superconducting PCB is a PCB in which at least one of the traces on the PCB is superconducting in a range of temperatures. Production of superconducting PCBs can include etching away a layer of copper on an underlying layer of superconducting metal in predetermined areas, in order to provide a desired pattern of superconducting links on the surface of the superconducting metal. The superconducting metal may consist of, or may include, aluminum.

Challenges inherent in non-superconducting electronics (for example, power consumption and heat dissipation) may limit the capabilities of a non-superconducting PCB technology. These challenges may be overcome, or circumvented, by changing to a superconducting technology. Superconducting technology can offer advantages over conventional, non-superconducting electronics. Superconductors can operate in a regime of little to no electrical resistance, and therefore do not generate heat to the same extent as conventional non-superconducting devices. Furthermore, superconducting devices can achieve very high operational speeds.

Superconducting circuits can use single-layer or multi-layer PCBs. A superconducting connection can be provided to an internal layer of a multilayer circuit board structure, for example by a superconducting via (also referred to in the present application as a VIA or a superconducting vertical interconnect access).

Technology described in the present application may be used during manufacture of a multilayer superconducting PCB that includes superconducting electrical communication between at least two layers of the multilayer superconducting PCB by at least one superconducting via. In some implementations, at least one of the layers is an inner layer of the multilayer superconducting PCB (i.e., not a top layer or a bottom layer). Typically, the inner layer is not physically accessible from an exterior of the substrate structure except by a via, through-hole or other opening. Superconducting PCB technology represents an important advancement in the field of superconducting electronics, and can facilitate the development of more sophisticated superconducting circuits than before.

Throughout this specification and the appended claims, the terms "insulative material", "insulative medium" and "insulative substrate" are used interchangeably to describe an electrically insulative substrate which electrically insulates conductive or superconductive current paths from one another. The electrically insulative material may be, for example, a polyimide (e.g., Kapton®), AD1000, and/or a suitable polytetrafluoroethylene (PTFE) composite. The electrically insulative material may be provided as a substrate layer having opposed surfaces which may serve as a physical structure surface upon which the conducting and/or superconducting paths of the circuit may be carried. The physical structure upon which the conducting and/or superconducting paths of the circuit may be carried is also referred to in the present application as a core. The superconductive paths may be plated (e.g., by hot air solder leveling) or otherwise deposited, printed or formed using various techniques.

In a multilayer PCB, multiple substrate layers of electrically insulative material may be sandwiched together to physically separate, and electrically insulate, various current paths from one another. This may be accomplished by plating or otherwise depositing, coating, printing or forming conductive current paths on the top and/or the bottom surfaces or faces of at least two substrate layers, and then sandwiching at least two layers together. In some implementations, the multilayer PCB can include an interface or intermediary layer or intermediate substrate between two substrate layers that separates two inner layers of conductive current paths.

There is generally an even number of conductive layers in a multilayer PCB. A multilayer PCB with an even number of conductive layers is referred to in the present application as an even-layer PCB. One way to produce a multilayer PCB with an odd number of conductive layers is to delete the metal from one or more layers of an even-layer PCB.

In another approach, the substrate structure may be built up "insulative substrate layer by insulative substrate layer", sequentially depositing electrically insulative material, conductive material and/or superconductive material to form the various layers. Drilling, etching or other techniques may be used to form one or more vias where the vias extend at least partially through one or more of the substrate layers.

Conductive current paths are also referred to in the present application as traces. In some implementations, traces are made using a conductive metal. In some implementations, conductive traces are made using copper. In some implementations, surfaces of the insulating material or substrate layers may first be coated with a sparse layer of a binding material, such as palladium or graphite, which allows the conductive traces to physically bind to the insulating medium.

In the present specification, the terms "normal metal", "normal non-superconducting metal" or "non-superconducting metal" are used to describe a conductive material, path or trace that is not superconducting at typical superconducting temperatures. Those of skill in the art will appreciate that the terms "normal metal", "normal non-superconducting metal" or "non-superconducting metal" may include pure elemental metals as well as metallic alloys.

A superconducting PCB may be fabricated by laying out the conductive traces of the circuit with a normal (non-superconducting) metal, such as copper, and then plating, or otherwise depositing or forming, a superconducting metal (e.g., aluminum, tin or lead) on the normal (non-superconducting) metal. The conductive traces of the circuit may be deposited, or otherwise formed, on at least one surface or face of an insulative medium. In some implementations, a sparse layer of a binding material (for example, a silane, palladium or graphite) may be included to help bind the conductive traces to the insulative medium. Multiple conductive layers may be separated by respective layers of the insulative medium. In some implementations, the respective layers of the insulative medium are layers of the same insulative medium.

Superconducting electrical communication between two outer layers of a superconducting PCB (e.g., between the top and bottom layers of a superconducting PCB) can be achieved using a superconductor-plated through-hole. The superconductor-plated through-hole is also referred to in the present application as a superconducting via. In one implementation, a superconducting via can be created by forming (e.g., drilling or etching) a hole through the PCB, plating the hole with a non-superconducting (normal) metal, and then plating the non-superconducting metal with a superconducting metal. In some implementations, the superconducting via is created by forming a hole right through the PCB, for example from one surface such as a top surface of the PCB to an opposing surface such as a bottom surface of the PCB. In some implementations, the non-superconducting metal is copper. In some implementations, the superconducting metal is tin or lead. In some implementations, the superconducting metal is an alloy (for example, an alloy of tin and lead). In some implementations, a layer of palladium or graphite may be used to bind the non-superconducting metal (e.g., copper) to an insulative medium.

Plating the hole with a non-superconducting metal can include depositing a conductive metal onto an insulative medium via an electroless deposition process using a catalyst (for example, palladium) and/or a reducing agent (for example, formaldehyde). Plating the hole with a non-superconducting metal can include using a direct metallization process. Plating the hole with a non-superconducting metal can include depositing a conductive material (for example, graphite, palladium or a conductive polymer such as polypyrrole) on an insulative material.

While a superconducting multilayer PCB formed using the method described above provides superconducting electrical communication between two outer layers of the PCB (e.g., between the top and bottom layers of the PCB), a limitation of the method is that the superconductor-plated through-hole does not establish a superconducting communication path between an outer layer and an inner layer of the superconducting PCB, or between two inner layers of the superconducting PCB.

In the construction described above, plating the hole with non-superconducting metal such as copper can physically separate the superconducting inner layers from superconducting metal plated over the non-superconducting metal. Though a non-superconducting metal such as copper may be a good conductor at room temperature, it is not superconducting when the PCB is cooled to a temperature at or below the critical temperature of the superconducting metal (e.g., tin). The superconductor-plated through-hole technique described above does not provide superconducting communication between inner layers of the multilayer PCB, or between an outer layer and an inner layer of the multilayer PCB.

Some fabrication methods for multilayer PCBs and multi-metal PCBs include adding or removing one metal in the presence of another. Some implementations of multilayer superconducting PCBs include superconducting communication between an inner superconducting layer and at least one other superconducting layer in the PCB. Inter-layer superconducting communication between two superconducting layers may be accomplished using superconducting vias.

One way to fabricate a multilayer PCB having a superconducting path between an inner layer and an outer layer is to build two or more two-layer PCBs with superconducting traces and vias, and bond the two-layer PCBs together in a multilayer stack. The superconducting traces and vias may include aluminum, for example. Through-holes can be drilled, for example, after the two-layer PCBs are bonded together, and can be plated through to create superconducting electrical communicative coupling between layers. Interlayer communicative coupling can be made by a soldering of wires or metal braids through the holes, laser ablation and wirebonding, or another suitable method.

Etchant Formulation

The present application describes a formulation of an etchant that can, for example, be used in the manufacture of an integrated circuit, a PCB, or other suitable circuit or product. In one implementation, the etchant is used to etch copper during manufacture of a PCB. In one implementation, the etchant is used to etch copper during manufacture of superconducting circuits on a superconducting PCB. The superconducting metal on the PCB may consist of, or may include, aluminum. The superconducting metal may be deposited on a normal (non-superconducting) metal using an electrolytic, electroless, chemical vapor, or physical vapor deposition process. The PCB may be used in a superconducting processor, e.g., a superconducting quantum processor.

In one implementation, an etchant includes hydrogen peroxide, sulfuric acid and copper together with a catalyst and one or more stabilizers that can at least reduce degradation of the etchant (for example of the hydrogen peroxide), improve a yield, and/or establish a higher etch rate including, for example, for etching of conventional copper foils and copper through-holes used in the manufacturing of PCBs.

In one implementation, the etchant includes:
i) approximately 35% w/w (weight-to-weight ratio) or 50% w/w aqueous solution of hydrogen peroxide American Chemical Society (ACS) grade reagent, at a concentration of between 2% and 15% by volume;
ii) sulfuric acid (electrolytic grade, S.G. 1.84), at a concentration of between 2% and 15% by volume; and
iii) copper in the form of copper sulphate pentahydrate ACS grade reagent, 98%-99%, at a concentration of between 2.0 grams/liter and 16.0 grams/liter.

One or more compounds can be used to contribute to stabilization of a peroxide-sulfuric acid micro-etchant such as the one described above. The compounds can also increase etching performance for thicker copper foils and/or electroplated copper in a peroxide-sulfuric acid. The compounds can include the following:
a) A catalyst, e.g., a metal-based compound typically in a +6-oxidation state for increasing the etch rate beyond an etch rate achievable using either hydrogen peroxide alone or a standard approach for conventional micro-etches used in electroless/electrolytic deposition processes. A typical catalyst may be palladium, gold, platinum, silver, tungsten, or molybdenum. The catalyst may be added as a hexavalent ion. The catalyst may be added in a lower valence form, as hydrogen peroxide can oxidize the metal ion to a higher valence.

Sodium tungsten oxide dihydrate and sodium molybdate are examples of compounds of hexavalent metals that can be used as a catalyst. Sodium tungstate is hexavalent and water-soluble, and can be used in concentrations of up to 1000 parts per million (ppm). In one implementation, sodium tungstate is used as a catalyst at a concentration of less than 75 ppm.

A typical etch rate for an electroless copper process is 40 to 60 microinches in 1 to 2 minutes. A typical etch rate for a pre-clean microetch in a copper electroplating process is 10 to 15 microinches per minute. These etch rates may be inadequate for etching a thicker copper foil (for example, 0.5 to 1.0 oz copper foil), or electrolytic copper of the same thickness, using a peroxide-sulfuric acid microetch, for example. It can be advantageous to incorporate a catalyst in the peroxide-sulfuric acid microetch. The catalyst can be selected to increase the etch rate, i.e., to increase the etch rate beyond an etch rate of a typical micro-etch used in electroless or electrolytic deposition processes. For example, the catalyst can be selected to act as a synergistic co-oxidant with the hydrogen peroxide of the microetch.

Tungsten (e.g., in the form of sodium tungsten oxide dehydrate) can increase an oxidation potential of a microetch formulation. Tungsten can cause an increase in the etch rate over a generic standard at concentrations of 2.0 ppm to 100 ppm. Using tungsten in combination with a first stabilizer (e.g., 1,6 hexanediol) can help to maintain the etch rate over time, and to improve or at least maintain yields of the formulation as copper builds up in solution. Additionally, or alternatively, using tungsten in combination with the first stabilizer (e.g., 1,6 hexanediol) can reduce the size of outgassed hydrogen bubbles, and improve etching of smaller defined features. In an example formulation, sodium tungsten oxide dihydrate can be used at a concentration of 89.5 ppm (i.e., 50 ppm tungsten) in the made-up bath.

b) A first stabilizer—The first stabilizer can advantageously at least reduce degradation of hydrogen peroxide in the microetch. The stability of a micro-etch can be detrimentally affected by the presence of heavy metal ions (for example, copper) which can build up in the etch. As the presence of copper ions increases, the etch rate can decrease owing to decomposition of hydrogen peroxide. Degradation can occur when negative ions such as chloride are introduced into the make-up which can occur, for example, when using water other than deionized water. Chloride concentrations over 10 ppm without a stabilizer can cause an etch rate to be impracticably slow.

The first stabilizer can be, for example, an organic compound whose molecule includes one or more hydroxyl groups attached to a carbon atom (also referred to in the present application as an alcohol). In some instances, the first stabilizer has two hydroxyl groups attached to a carbon atom, and is also referred to in the present application as a diol. It can be advantageous to use a diol in a peroxide-sulfuric acid microetch. For example, incorporating a diol in a peroxide-sulfuric acid microetch can increase etch rates, and increase yield by limiting degradation of hydrogen peroxide.

It can be advantageous to use a longer-chain diol or a substituted diol. It can also be advantageous to use a diol with sufficient water solubility. An example of a diol that can be used advantageously as a first stabilizer in a microetch is 1,6 hexanediol. In one implementation, 1,6 hexanediol is used as the first stabilizer at a concentration of approximately 10% w/w (weight-to-weight ratio).

In some implementations, adding 1,6 hexanediol to the etchant can increase the etch rate, reduce etch time, reduce attack of a photoresist and/or reduce undercut during etching. A drawback of adding 1,6 hexanediol to the etchant is that it can cause an increase in hydrogen outgassing. The increase in hydrogen outgassing can result, at least in part, from an increase in the etch rate.

Hydrogen outgassing can negatively affect the photoresist. In one implementation, using 1,6 hexanediol in combination with a second and/or third stabilizer can reduce hydrogen outgassing. In an example formulation of etchant, 1,6 hexanediol is at a concentration of 3% w/v in the bath, and at a concentration of 10% w/v in the make-up and concentrate.

c) A second stabilizer that can advantageously at least slow down or otherwise reduce degradation of hydrogen peroxide. Whereas the first stabilizer can at least reduce a breakdown from negative ions (for example, negative chloride ions introduced from chlorinated water), the second stabilizer can inhibit a breakdown from positive ions in the water. Examples can include positive metal ions such as magnesium, iron, nickel, manganese, antimony, and calcium.

The second stabilizer may be a six-member substituted ring, typically a sulfate or an amine compound that is, in some instances, attached to phosphoric acid. Examples include aryl sulfonic acids, sodium phenol sulfonate dihydrate, amino-tris(methylene phosphonic acid), and 1-hydroxyethylidene (1,1 phosphonic acid). The chemical amino-tris(methylene phosphonic acid) is also referred to as ATMP or aminotri (methylene phosphonic acid).

It can be advantageous for the second stabilizer to be a neutral compound with a pH of around 6 to 8, for example sodium 4-hydroxybenzene sulfonate dihydrate. In one implementation, sodium 4-hydroxybenzene sulfonate dihydrate is used as the second stabilizer at a concentration of 2.0 to 4.0 grams per liter.

In some implementations, adding sodium 4-hydroxybenzene sulfonate dihydrate to an etchant can increase an etch rate. Another suitable compound can be used as an additive, e.g. a compound that can bind positive ions. Positive ions that can be introduced into the etch can be iron, magnesium, and the like. As described elsewhere in the application, positive ions can degrade hydrogen peroxide in an etchant, and can decrease yield. Yield refers to a yield of a product produced in a process where the process includes a microetch, e.g., a microetch of copper.

Sodium 4-hydroxybenzene sulfonate dihydrate is an example of a second stabilizer that can be used in combination with a first stabilizer (e.g., 1,6 hexanediol) to reduce the size of hydrogen outgassing bubbles, and improve etching of smaller defined features.

d) A surfactant—i.e., a compound used to lower the surface tension of a solution. A surfactant may be used to assist the chemistry to be able to interact with tight features. Tight features are also referred to in the present application as smaller defined features. A surfactant is typically a cationic, anionic, or non-ionic long-chain polymer used to reduce surface tension. A hydrophilic group of a cationic surfactant can dissociate into cations in an aqueous solution. Similarly, a hydrophilic group of an anionic surfactant can dissociate into anions in an aqueous solution.

In some implementations, the surfactant is compatible with hydrogen peroxide, and can be combined in solution with hydrogen peroxide without breaking down. A surfactant can be used in low concentrations in a formulation, for example, at a concentration of between 0.01% and 1.0% by weight.

e) A third stabilizer—typically a phosphate compound that is added to the peroxide-sulfuric acid microetch. The phosphate ion can help to inhibit an attack on a photoresist that is being used when the superconducting metal being etched is tin or tin/lead. Without the third stabilizer, the tin or tin/lead surface may darken, which may cause a problem if the metal is re-flowed.

In some implementations, a microetch is a concentrated formulation. It can be beneficial, for example for shipping and storage, for the microetch to be a concentrated formulation. It can be advantageous for the concentrated formulation to be stable, and have no flocculation, precipitation or cloudiness. It can also be advantageous for the concentrated formulation (when diluted) to have at least approximately the same etch properties as a dilute formulation.

Hydrogen Outgassing

Hydrogen outgassing can occur when using a hydrogen peroxide/sulfuric acid microetch, and is generally the result of a reaction between a metal and the etchant. The volume of hydrogen outgassing, and the size of outgassed hydrogen bubbles can depend on the chemical formulation of the etchant.

Hydrogen outgassing typically has little or no impact on etching metals when the metal has large defined features or no defined features, for example when a hydrogen peroxide/sulfuric acid microetch is used to etch a surface. Hydrogen outgassing can have more impact when etching a photo-lithographically patterned image, e.g., a pattern-plated copper surface, at least in part because the image may include smaller defined features.

Hydrogen outgassing can result from an interaction of the hydrogen peroxide/sulfuric acid etchant, a photoresist, and/or a metal, for example. At least some outgassed hydrogen can adhere to a photoresist/copper interface, and can cause etching at least locally to slow down or even stop. The effect can be particularly evident on smaller lines and/or traces. Adhesion of outgassed hydrogen can become more pronounced for smaller features, and can cause more unwanted metal (e.g., copper) to remain at least locally. In some situations, incomplete etching can cause an electrical short in a circuit unless the circuit is subsequently reworked to remove the remaining unwanted metal.

Yields may be improved when using a hydrogen peroxide/sulfuric acid etchant and an imaged substrate by several methods, for example:

a) using ultrasonic waves to dislodge outgassed hydrogen from the photoresist/metal surface;
b) using bump agitation to dislodge hydrogen gas from through-holes in electroless copper deposition; and/or
c) using a surfactant in the microetch.

Examples (a) and (b) above are examples of a physical approach to improving yields. Shortcomings of examples (a) and (b) can include incomplete removal of outgassed hydrogen and/or a difficulty in dislodging hydrogen gas from a photo-defined copper interface at an acceptable yield.

High surface tension can increase adhesion of outgassed hydrogen to the photoresist/metal surface or, in some cases, to a liquid/solid interface. High surface tension of a microetch, and interaction of the microetch with the imaged photoresist can restrict removal of the outgassed hydrogen. This can be more likely to occur, for example, when etching thicker electroplated copper or foils used in the manufacturing of PCBs. One cause can be the increased etch rate and the higher volume of outgassed hydrogen.

Lowering the surface tension can improve wetting of the photoresist/metal surface, and can impede the outgassed hydrogen from adhering to the photoresist-copper surface interface. A wetted low-surface-tension microetch formulation across the entire imaged surface can be desirable, and can increase the yields of an etched surface.

A shortcoming of some microetch formulations is that etching, for example etching of copper, can be incomplete. In the case of copper etching, incomplete etching can result in copper still being present in areas where it is desirable for the copper to be as fully removed as possible by the microetch formulation. For example, the surface post-etch can include islands or pockets where the etch is incomplete, resulting in non-uniformities and inconsistencies in the surface post-etch. Incomplete etching can be attributed in at least some scenarios to outgassing (for example, hydrogen outgassing) that occurs during etching, and gases being at least partially attracted or held by a photoresist-developed image. The effect can become more severe as the sizes of a photo-imagable defined features in the etch are reduced, and can lead to electrical shorts and poor yields.

It can be advantageous to lower the surface tension of the microetch to at least inhibit the outgassed gases from adhering to developed sides of a photoresist by causing the wetted surface to release the gases as they are produced. One approach to lowering the surface tension of the microetch is to introduce a surfactant into the microetch formulation. At low enough concentrations, a surfactant will have little or no effect on other properties of the microetch. It is desirable that the surfactant is compatible with other constituents of the microetch formulation.

As previously described, surfactants can be classed as cationic, anionic, and non-ionic. Though many different surfactants are generally available, not all of them are soluble in a formulation comprising sulfuric acid at 10% concentration. Furthermore, when hydrogen peroxide is a constituent of the microetch, the hydrogen peroxide can cause a surfactant to break down, for example by breaking or oxidizing polymer chains, and thereby rendering the surfactant less effective.

An example of a surfactant is a short-chain non-ionic fluorosurfactant such as Thetawet™ FS-8050. Thetawet™ FS-8050 can be soluble in 10% sulfuric acid/deionized water solution. Deionized water is also referred to in the present application as DI water.

Ingredients of an example formulation of a microetch is described in Table 1. Thetawet™ FS-8050 was found to be soluble and stable in the example formulation of Table 1.

TABLE 1

Ingredients of an example microetch formulation comprising a surfactant

| Chemical | Concentration/Grade |
|---|---|
| 1. DI water | |
| 2. Sulfuric Acid | ACS, 95.0-98.0% |
| 3. Copper Sulfate 5H2O | ACS |
| 4. Thetawet FS-8050 | ICT |
| 5. 1,6 Hexanediol | 97% |
| 6. Sodium 4-Hydroxybenzenesulfonate Dihydrate | 97% |
| 7. Sodium Tungsten Oxide Dihydrate | ACS, 99.0-101.0% |
| 8. Hydrogen Peroxide | 35% |

Two-Stage Process for MicroEtch

A shortcoming of a microetch formulation comprising a surfactant (e.g., a fluorosurfactant) is that it can lead to an uneven and/or incomplete etch. In the particular scenario of etching copper on aluminum, etching of the copper exposes the aluminum surface and an immersion deposit can be formed. The copper in solution can deposit on the aluminum leading to the appearance of copper spots on the aluminum surface. A possible explanation for the appearance of copper spots on the aluminum surface is that the surfactant interferes to some extent with the ability of the copper to stay in solution.

In some implementations, the copper being etched includes copper previously deposited to overlie aluminum. During etching, the underlying aluminum can be exposed. Typically, more aluminum becomes exposed at longer dwell times. Exposed aluminum can be displaced by copper from copper sulfate in the microetch formulation. In some cases, it is possible to see by visual inspection a reddish color on the aluminum surface which indicates a depositing of copper on the aluminum surface.

The aluminum can be more reactive than the copper, and displaced aluminum can form aluminum sulfate in solution as follows:

The depositing of copper from the solution can cause an electrical short in the product, for example. Additionally, or alternatively, the depositing of copper can inhibit removal of aluminum in subsequent acts or operations.

The above are two shortcomings of using the microetch formulation described above where the formulation includes the three additives and has the concentrations described. The two shortcomings can, alone or in combination, cause decreased yields.

In other scenarios (e.g., where the copper has not been previously deposited to overlie aluminum), the copper can react with sulfuric acid in the microetch formulation to form copper sulfate, and the etch can be more successful.

One approach to at least mitigating interference by the surfactant that can lead to incomplete etching is to adopt a two-stage process, as follows:

1. Process the surface to be etched (e.g., a patterned image) using a low-surface-tension cleaner (e.g., a fluorosurfactant); and
2. Immerse the surface in a microetch formulation that does not include the low-surface-tension cleaner.

An advantage of a two-stage process, such as the one described above, is that features of the surface to be etched can be wet prior to immersion in the etchant. Wetting of the features can improve the quality of an etch, for example it can increase an etch rate. The two-stage process eliminates, or at least reduces, interference of the surfactant with the etching. In the case of etching copper on aluminum, the two-stage process can reduce the number and size of unwanted copper deposits on the aluminum post-etch.

Table 2 lists ingredients of an example formulation of a low-surface-tension cleaner. Table 3 lists ingredients of an example formulation of an etchant. The low-surface-tension cleaner of Table 2 can be used in the first stage of the two-stage etch process described above. The etchant of Table 3 can be used in the second stage of the two-stage etch process described above.

TABLE 2

Ingredients of Example Cleaner Formulation

| Chemical | Concentration |
|---|---|
| 1. DI Water | |
| 2. Sulfuric acid | 2.5% by volume |
| 3. Surfactant (e.g., Thetawet ™ FS-8050) | 0.025% |

TABLE 3

Ingredients of Example Microetch Formulation

| Chemical | Concentration |
|---|---|
| 1. DI Water | |
| 2. Sulfuric acid | 10% by volume |
| 3. Copper sulfate pentahydrate | 15.7 g/l |
| 4. 1,6 hexanediol | 3% w/w |
| 5. Sodium hydroxybenzene sulfonate•2H2O | 2.4 g/l |
| 6. Sodium tungstate•2H2O | 50 ppm tungsten |
| 7. Hydrogen peroxide | 13% by volume |

Concentrated Formulation

Sometimes sulfuric acid is included in the make-up of the microetch formulation, and sometimes sulfuric acid is added prior to use. In an example implementation, the concentration of sulfuric acid included in the make-up of the microetch is 33% by volume. An advantage of including sulfuric acid in the make-up is that it can at least reduce the impact of an exothermic reaction that can occur when sulfuric acid is combined with water. Since sulfuric acid is commonly available, sulfuric acid may be added to the microetch at the place of use.

Multilayer Superconducting PCB

Figure 1A:
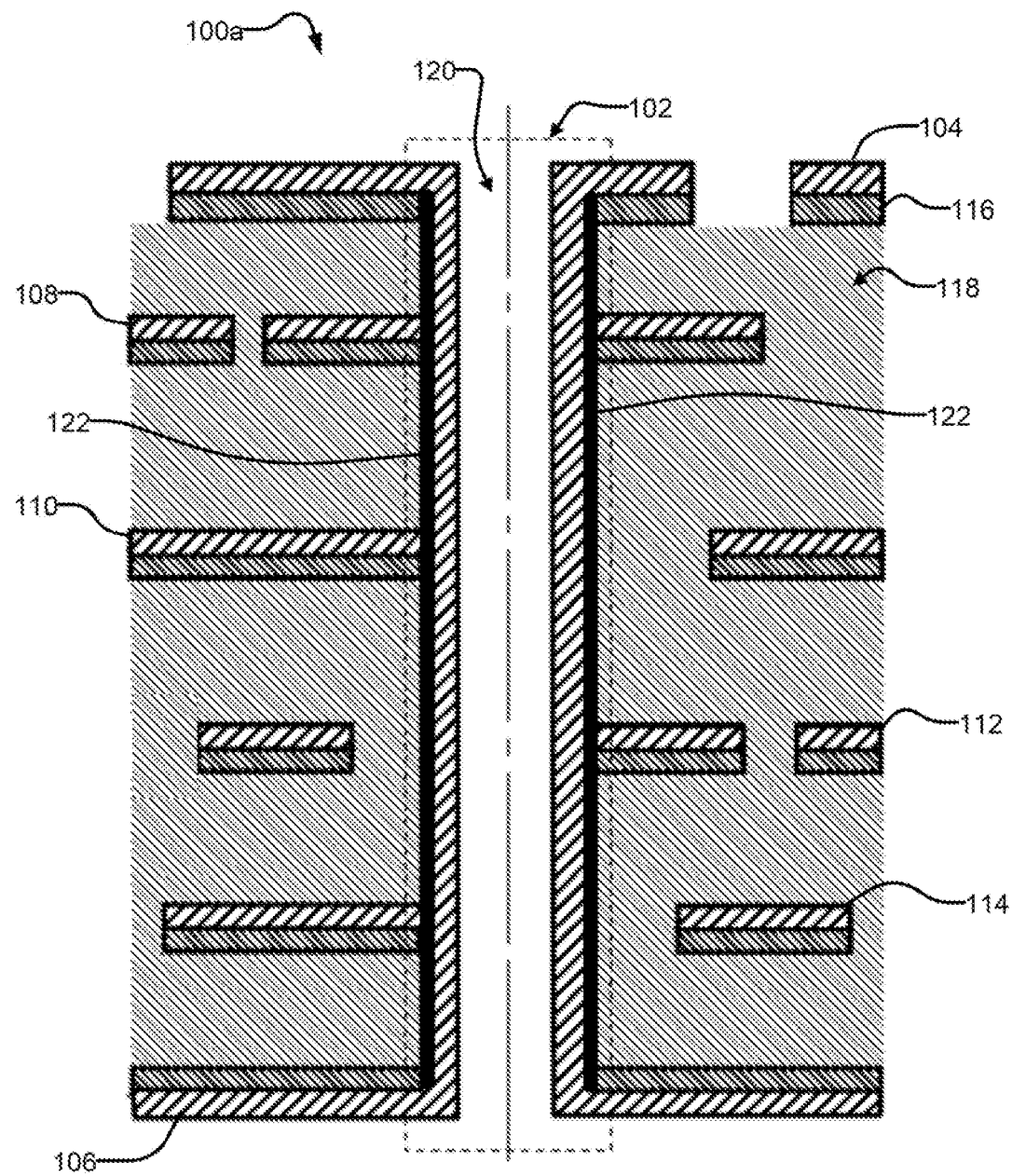
FIG. 1A is a cross-sectional view of a portion of a multilayer superconducting printed circuit board that provides inter-layer superconducting communication through a superconducting via, according to one illustrated implementation of the present disclosure.

FIG. 1A is a cross-sectional view of a portion of a multilayer superconducting PCB 100a that provides inter-layer superconducting communication through a superconducting via 102. Multilayer superconducting PCB 100a may be fabricated using systems and methods described in the present application.

Multilayer superconducting PCB 100a includes two outer superconducting layers 104 and 106 (top and bottom layers, respectively) and four inner superconducting layers 108, 110, 112, and 114. Superconducting layers 104, 106, 108, 110, 112, and 114 at least partially overlie an intervening layer 116. In some implementations, intervening layer 116 includes a non-superconducting metal. In some implementations, intervening layer 116 includes a binding material, for example a silane, palladium or graphite, to help bind the superconducting metal to the adjacent layer. Superconducting PCB 100a includes substrate 118. In some implementations, substrate 118 forms a core of multilayer superconducting PCB 100a.

Superconducting via 102 extends through PCB 100a, however those of skill in the art will appreciate that superconducting via 102 may extend only part-way through PCB 100a depending on the layout of the superconducting traces in PCB 100a. Via 102 may be formed in a variety of ways, for example mechanical drilling, laser drilling, etching, etc.

One technique for fabricating a superconducting trace on a PCB is to plate a non-superconducting metal with a superconducting metal. Another technique for fabricating a superconducting trace is to lay or carry a superconducting trace upon a surface of the insulative medium. In the example implementation of FIG. 1A, superconducting traces in superconducting layers 104, 106, 108, 110, 112, and 114 are laid or carried upon intervening layer 116. In some implementations, the conductive traces of a superconducting circuit may be laid out with a superconducting metal, such as niobium, to overlie a surface of the insulative medium without an intervening layer of non-superconducting metal. Some implementations may include, in addition or instead, a layer of binding material, for example a silane, palladium or graphite.

Some superconducting vias are formed by plating the walls of a through-hole with a non-superconducting metal, and then plating the non-superconducting metal with a superconducting metal. Superconducting via 102 is formed by plating the walls of through-hole 120 with a superconducting metal. The superconducting metal has no underlying non-superconducting metal. Optionally, a sparse layer of binding material 122, such as palladium, may be used to bind the superconducting metal to the insulative medium. The omission of the non-superconducting plating, for instance the copper plating, from the process of fabricating superconducting via 102 allows superconducting connections to be formed between the walls of superconducting via 102 and the inner superconducting layers 108, 110, 112, and 114, and thereby allows the fabrication of improved multi-layer superconducting PCBs.

In implementations that include a sparse layer of binding material, such as palladium, superconducting connections between the superconducting via and the inner layers of the PCB can be made if the binding material is itself superconducting, or if the layer of binding material is sufficiently sparse, for example. PCB 100a of FIG. 1A has established superconducting electrical communicative coupling between portions of all layers.

Those of skill in the art will appreciate that both the layout and number of superconducting layers 104, 106, 108, 110, 112, and 114 shown in FIG. 1A are meant to serve only as examples. The present systems, methods and apparatus may be applied to any multilayer superconducting PCB configuration. Those of skill in the art will appreciate that a given multilayer superconducting PCB may use any number of superconducting vias to communicate superconductingly between layers.

Figure 1B:
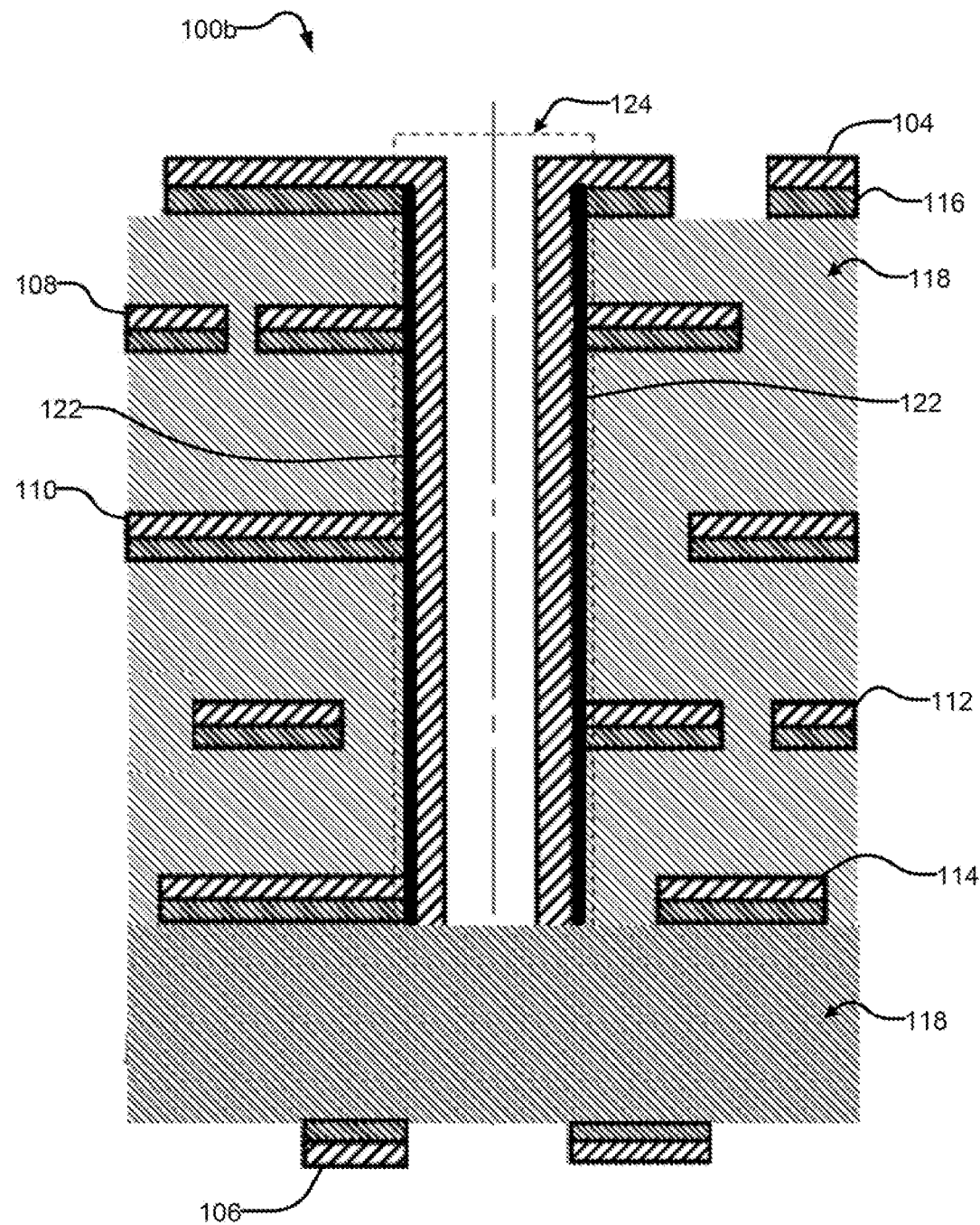
FIG. 1B is a cross-sectional view of a portion of a multilayer superconducting printed circuit board that provides inter-layer superconducting communication through a blind superconducting via, according to one illustrated implementation of the present disclosure.

In some implementations, as mentioned above, a superconducting via may extend only part-way through the PCB, in which case the superconducting via is also referred to in the present application as a blind superconducting via. FIG. 1B is a cross-sectional view of a portion of a multilayer superconducting printed circuit board 100b that provides inter-layer superconducting communication through a blind superconducting via 124, according to one illustrated implementation of the present disclosure. Like-numbered elements of FIG. 1B are at least similar to the corresponding elements of FIG. 1A.

Figure 1C:
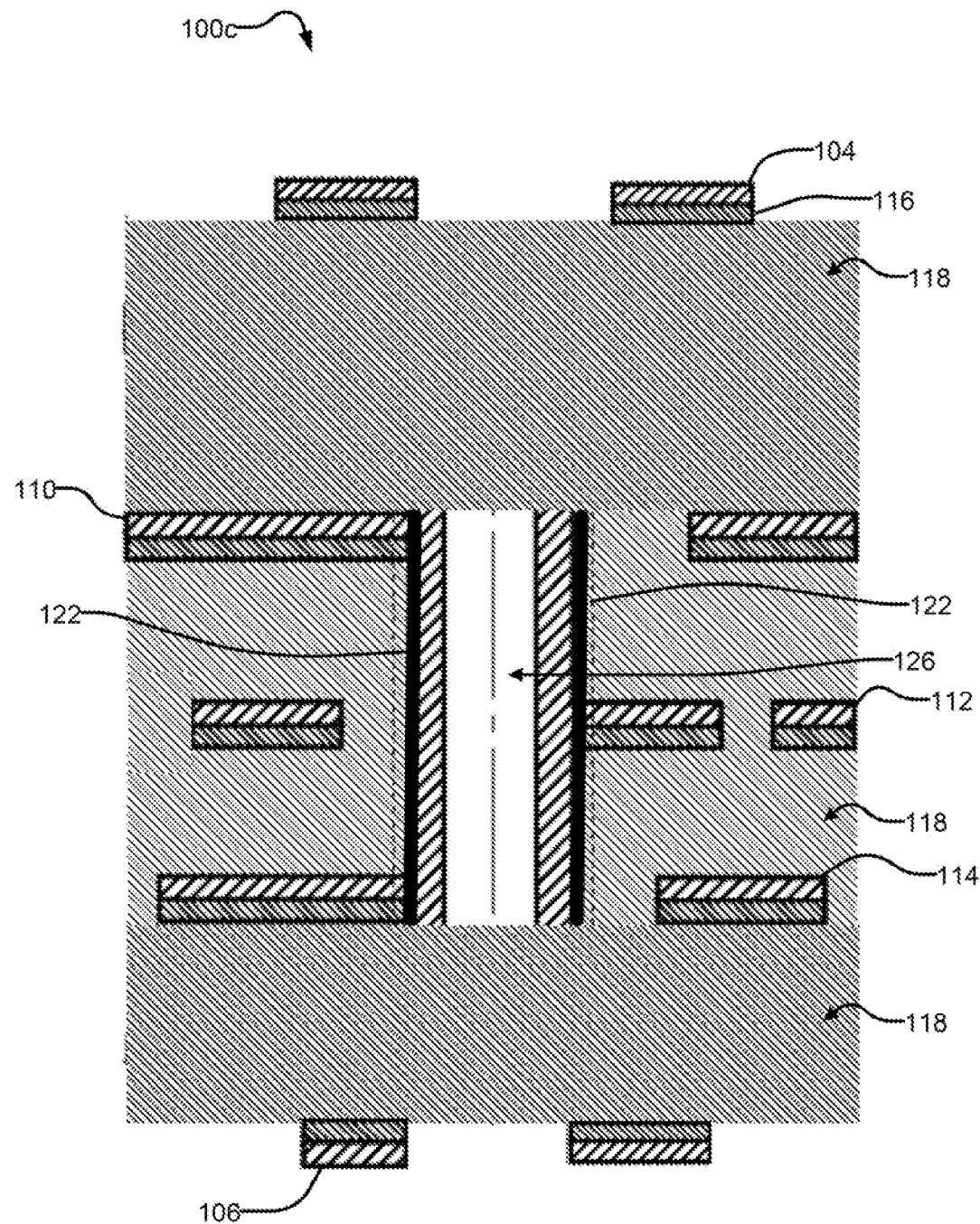
FIG. 1C is a cross-sectional view of a portion of a multilayer superconducting printed circuit board that provides inter-layer superconducting communication through a buried superconducting via, according to one illustrated implementation of the present disclosure.

In other implementations, a superconducting via may be completely contained within the PCB, and not visible from the surface of the PCB. This type of via is also referred to in the present application as a buried superconducting via. FIG. 1C is a cross-sectional view of a portion of a multilayer superconducting printed circuit board 100c that provides inter-layer superconducting communication through a buried superconducting via 126, according to one illustrated implementation of the present disclosure. Like-numbered elements of FIG. 1C are at least similar to the corresponding elements of FIG. 1A.

In some implementations, it may be more practical to drill holes or passages for a blind superconducting via or a buried superconducting via such that they extend right through PCB 100. Advantages of this approach can include lower costs and a simpler fabrication process. In such implementations, the layouts of the superconducting traces on each layer of a multilayer superconducting PCB may be arranged to accommodate holes or gaps in each layer as required.

Fabrication of a Superconducting PCB (e.g., an Aluminum (Al) PCB)

Building a Simple Core for a Multilayer PCB

In some implementations, the core for a multilayer PCB is fabricated from a commercially available core with no copper (Cu) cladding. In other implementations, the core for a multilayer PCB is fabricated from a commercially available copper-clad PCB core by removing the copper. In both cases, the core can be selected to have a desired thickness. The dielectric material of the core can be a polyimide (e.g., Kapton®), AD1000, and/or a suitable PTFE composite. In some multilayer PCBs, the core includes only one type of dielectric material. In other multilayer PCBs, the core includes more than one type of dielectric material. The choice of dielectric(s) can be based, at least in part, on a) a glass transition temperature of the dielectric, which can describe a desired resistance to the heat of soldering, for example, and b) a loss tangent of the dielectric, which can describe electromagnetic energy absorbed by mobile ions or two-level systems in the dielectric. At the glass transition temperature, the dielectric can become soft and start to degrade. The loss tangent can quantify a dielectric's inherent dissipation of electromagnetic energy (e.g., heat).

The PCB stack-up can be arranged on an unclad core. In one implementation, bimetal foil is used, and the stack-up is as follows: bimetal foil (Cu/Al/Cu), pre-preg, core, pre-preg, bimetal foil (Cu/Al/Cu). The stack-up can be heat-pressed, and baked, to form a bimetal-foil-clad core.

Suitable bimetal foils include bimetal foils made by Metfoil (Sweden) and Hanita Coatings (Israel). Pre-preg is a woven fiberglass cloth impregnated with a partially-cured resin, and can be used as a glue or bonding agent. A suitable pre-preg can be selected based, at least in part, on its curing characteristics including temperature, curing time, and pressure. The pre-preg characteristics can be tuned to improve its adhesion to aluminum or copper, for example. The pre-preg characteristics can also be tuned to achieve a desired final thickness of the bimetal-foil-clad core.

The stack-up can be varied to suit the requirements of the PCB being fabricated, including a desired thickness and number of metal layers. For example, in one implementation, the stack-up is as follows: bimetal foil (Cu/Al/Cu), pre-preg, bimetal-foil-clad core, pre-preg, bimetal foil (Cu/Al/Cu), where the bimetal-foil-clad core has a stack-up as described in an earlier paragraph. In another implementation, the stack-up is as follows: bimetal foil (Cu/Al/Cu), pre-preg, core, pre-preg, bimetal-foil-clad core, pre-preg, core, pre-preg, bimetal foil (Cu/Al/Cu).

The bimetal foil in these and other stack-ups can be replaced by simple copper foil. A simple aluminum, or an Al/Cu foil, can be used provided there is sufficient adhesion between the aluminum and the pre-preg. Surface modifications can be made to improve the adhesion between the aluminum and the pre-preg. In some implementations, a metal layer can be omitted, and two pre-preg layers can be placed adjacent to one another, for example to achieve a desired thickness, or a non-standard thickness. Pre-preg can be replaced in the stack-up by other adhesives, for example, heat-cured, humidity-cured, and/or time-cured adhesives. Double-sided tape can be used in place of pre-preg.

Building the Inner-Layer-Patterned Core for a Multilayer PCB

Each of the metal layers in the core can be patterned into aluminum circuits after lamination, and while the metal is still exposed. Top and bottom metal layers can be patterned. Cores with patterned metal can be combined with other patterned or non-patterned cores. A non-patterned core is a core with unpatterned metal.

Alignment of the patterns can be achieved by drilling reference holes, or other mechanical features or fiducial markings, in the core. The reference holes can be mechanically aligned when the stack is assembled, and held in place ready for heat-pressing. Another way to align the patterns is to leave areas free of metal during patterning. Since the dielectric can be semi-transparent when it is sufficiently thin, alignment can be achieved by backlighting the dielectric. Other suitable methods of alignment can be used, for example X-ray or acoustic methods, or fiducial markings.

In some implementations, patterning includes patterning areas of metal that may not be electrically active to make a less-dense pattern, and to adjust the final thickness of the multilayer PCB. One or more patterned cores in the laminated multilayer PCB can be cores without aluminum metal.

Outer-Layer-Patterned Core

After completing a simple core or an inner-layer-patterned core for a multilayer PCB, the fabrication method can include patterning the top and/or bottom, outer layer of metal.

Copper patterning of the exposed (top) layer of copper in the Cu/Al/Cu foil can follow a conventional process that uses a suitable chemistry. Patterning can include applying a suitable resist material to prevent chemical etching in areas where copper is to remain.

Aluminum patterning can follow a process that uses a basic solution of potassium hydroxide (KOH) or sodium hydroxide (NaOH) to etch the aluminum. It is generally the case that most photoresists are unable to withstand KOH or NaOH, both of which can be used in other applications to remove a photoresist. One approach is to use the outer layer of copper in the Cu/Al/Cu foil as an etch resist. The method can include applying a suitable copper-compatible photoresist over the copper, and lithographically exposing the photoresist. After curing, and/or another suitable process to make the photoresist more durable, the method can include using a suitable copper-compatible etchant to remove copper, and expose bare aluminum. The etchant can be selected to preferentially remove copper rather than etching aluminum or creating a galvanically-enhanced etch of the copper-aluminum interface. For example, cyclo-etch FT-2 copper microetch from Electrochemicals Inc. (subsequently OM Group Suzhou Electronic Chemicals Co., Ltd.) can be a suitable choice of etchant. If the etchant is acidic, or contains hydrogen peroxide, it can cause an exposed aluminum surface to oxidize. A PCB mill can be used to perform patterning of aluminum, copper and/or a bimetal foil.

Galvanic corrosion can accelerate chemical etching, and, with some etchants, can cause etching of an Al/Cu interface at a rate at least an order of magnitude greater than the etching of either a copper layer on its own or an aluminum layer on its own. Galvanic corrosion can cause delamination of metal layers. In addition, etch rate can vary with the duration of the etch, the temperature of the etch, and the concentration of the etchant. Galvanic corrosion can be complicated by the presence of zinc at the Al/Cu interface which can be present if fabrication of the Cu/Al/Cu foil includes electroplating of copper onto aluminum where the aluminum surface is first immersed in zincate (an alkaline solution used in an immersion process to plate aluminum with zinc). Sodium nitrate, sodium nitrite, potassium nitrate, and/or potassium nitrite, can be used to limit galvanic corrosion. See, for example, U.S. Pat. No. 3,859,149 "METHOD FOR ETCHING ALUMINIUM ALLOYS".

Using the copper as an etch resist, the fabrication method can include removing aluminum to define traces on the PCB. The etch can be performed until the copper layer under the aluminum layer is exposed. If the aluminum is clad directly to the pre-preg (rather than to a copper layer), then the etch can be performed until the pre-preg is exposed.

Etching can undercut the aluminum under the top layer of copper (i.e., the layer of copper being used as an etch resist).

The width of aluminum traces on the PCB can be limited, at least in part, by the thickness of the aluminum layer. In some instances, the amount of undercut can be reduced by using a thinner aluminum foil.

After etching, the aluminum traces can have a trapezoidal, or triangular, cross-section with sloped sidewalls. A trapezoidal cross-section can be desirable for making wirebond pads, whereas a triangular cross-section can be more suitable for electrically-conductive traces.

During etching of the aluminum, chemical species can be consumed, and the ratios can move away from preferred values. Galvanic corrosion of the interface between the copper and the aluminum can accelerate in localized regions to cause "mousebites" which alone, or in combination, can cause a trace to be broken.

Additionally, the etch process can liberate hydrogen gas which can retard etching, or otherwise disturb the contact between etchant and metal. Typically, an etch-sprayer can be used to deliver etchant to the surface of the PCB in a spray. The spray can be applied under pressure, and directed at the PCB from the side, which allows liberated hydrogen gas to float away, or be washed away. An etch-sprayer can be used to control etch time and temperature. Some etch-sprayers can handle concentrated NaOH or KOH.

Fabrication of a Multilayer Superconducting PCB

Figure 2:
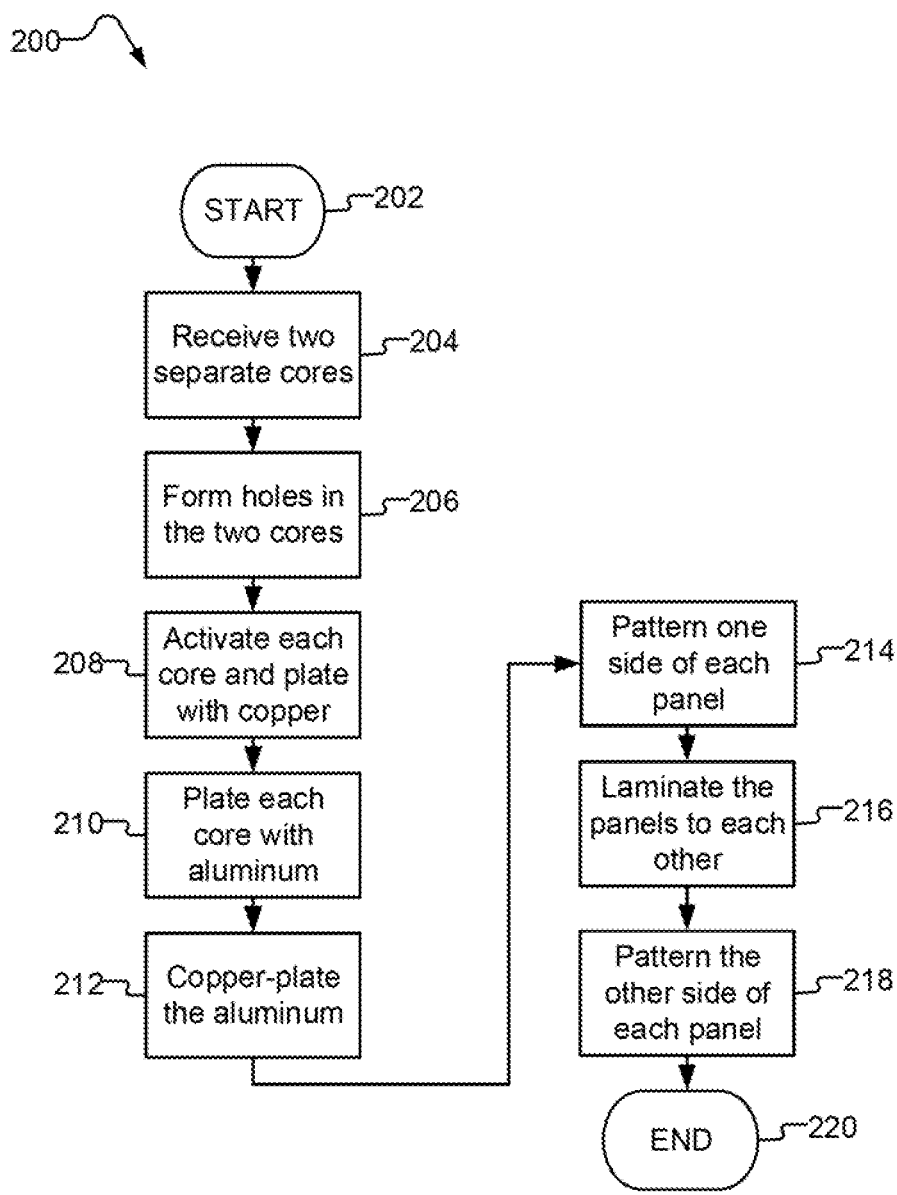
FIG. 2 is a flow chart illustrating a method for fabricating a multilayer superconducting printed circuit board, according to one illustrated implementation of the present disclosure.

FIG. 2 is a flow chart illustrating a method 200 for fabricating a multilayer superconducting printed circuit board, according to one illustrated implementation of the present disclosure. Method 200 includes acts 202-220, though those skilled in the art will appreciate that in alternative implementations certain acts may be omitted and/or additional acts may be added. Those skilled in the art will appreciate that the order of the acts is shown for exemplary purposes only and may change in alternative implementations.

At 202, the method starts. At 204, two separate cores comprising an electrically insulative substrate are received. At 206, one or more holes are drilled or formed in each of the two cores. At 208, each core is activated, and the electrically insulative substrate is copper-plated. At 210, each copper-plated core is plated with aluminum. At 212, the aluminum-plated core is plated with copper to form two panels each comprising a bimetal foil of Cu/Al/Cu. Other implementations may use other suitable bimetal foils.

At 214, one side of each core is patterned. The patterned side of each core becomes a respective inner layer of the multilayer PCB. At 216, the two panels are laminated to each other to form a multilayer superconducting PCB. At 218, the other side (i.e., the outer side) of each panel is patterned. At 220, the method ends.

Method 200 is described in more detail in International PCT Patent Publication No. WO2018106942A1) filed Dec. 7, 2017, entitled "MULTILAYER SUPERCONDUCTING PRINTED CIRCUIT BOARD RELATED SYSTEMS, METHODS, AND APPARATUS".

Example Cross-Sectional Views During Etching

FIGS. 3A, 3B, and 3C are cross-sectional views of an integrated circuit at different stages of a fabrication process, according to one illustrated implementation of the present disclosure. Though the description of FIGS. 3A, 3B, and 3C refers to fabrication of an integrated circuit, it can also be applied to fabrication of a multilayer printed circuit board (PCB), for example a multilayer superconducting PCB.

FIG. 3A is a cross-section view of a portion 300a of an integrated circuit at a first stage of the fabrication process. Portion 300a comprises a substrate 302. Substrate 302 can be an electrically insulative substrate which electrically insulates conductive or superconductive current paths from one another. The electrically insulative material may be, for example, a polyimide (e.g., Kapton®), AD1000, and/or a suitable PTFE composite.

FIG. 3B is a cross-section view of a portion 300b of the integrated circuit of FIG. 3A at a second stage of the fabrication process. Portion 300b comprises a bimetal foil 304 deposited on substrate 302. Bimetal foil comprises a first layer 306 of a first metal, a layer 308 of a second metal, and a second layer 310 of the first metal.

In some implementations, the first metal is a normal non-superconducting metal, for example copper. In some implementations, the second metal is a superconducting metal, for example aluminum.

In some implementations, bimetal foil 304 is deposited on the substrate by a) at least partially copper-plating electrically insulative substrate 302 to form layer 306 of copper, b) at least partially aluminum-plating first layer 306 of copper to form layer 308 of aluminum, and c) at least partially copper-plating layer 308 to form second layer 310 of copper.

FIG. 3C is a cross-section view of a portion 300c of the integrated circuit of FIGS. 3A and 3B at a third stage of the fabrication process. Portion 300c comprises the integrated circuit of FIG. 3B with second layer 310 removed by etching. For example, second layer 310 can be removed using a two-stage etching process described below with reference to FIG. 5. In some implementations, second layer 310 is only partially removed by etching.

FIG. 4 is a flow chart illustrating an etching process 400, according to one illustrated implementation of the present disclosure. Method 400 includes acts 402-414, though those skilled in the art will appreciate that in alternative implementations certain acts may be omitted and/or additional acts may be added. Those skilled in the art will appreciate that the order of the acts is shown for exemplary purposes only and may change in alternative implementations.

At 402, method 400 starts. At 404, method 400 forms a bimetal foil on a substrate. In some implementations, the substrate is an insulative substrate. In some implementations, the bimetal foil is a Cu/Al/Cu foil.

At 406, a first layer of a first metal is deposited, or otherwise formed, to at least partially overlie the substrate. In some implementations, the first metal is a non-superconducting metal. In some implementations, the non-superconducting metal is copper. At 408, a layer of a second metal is deposited, or otherwise formed, to at least partially overlie the first layer of the first metal. In some implementations, the second metal is a superconducting metal. In some implementations, the superconducting metal is aluminum. At 410, a second layer of the first metal is deposited, or otherwise formed, to at least partially overlie the layer of the second metal.

In some implementations, the bimetal foil is formed using a process at least similar to the one described with reference to FIG. 3 (above). In some implementations, the bimetal foil is deposited on the substrate by a) at least partially copper-plating electrically insulative substrate to form a first layer of a copper, b) at least partially aluminum-plating the first layer of copper to form a layer of aluminum, and c) at least partially copper-plating the layer of aluminum to form a second layer of copper.

In the present application, the term "at least partially copper-plating" a medium (e.g., a substrate or a layer) refers to copper-plating at least part of a surface of the medium. Similarly, the term "at least partially aluminum-plating" refers to aluminum-plating at least part of a surface of the medium.

At 412, method 400 etches the second layer of the first metal. In some implementations, the etching of the second layer of the first metal is a two-stage process, e.g., the two-stage process described below.

At 414, method 400 ends.

Two-Stage Etching Process with Cleaner and Etchant

FIG. 5 is a flow chart illustrating a method 500 for a two-stage etching process, according to one illustrated implementation of the present disclosure. Method 500 includes acts 502-514, though those skilled in the art will appreciate that in alternative implementations certain acts may be omitted and/or additional acts may be added. Those skilled in the art will appreciate that the order of the acts is shown for exemplary purposes only and may change in alternative implementations.

Though the description of method 500 refers to a patterned image, method 500 can be applied to any suitable circuit and/or product. For example, in some implementations, method 500 is applied to etch a metal from a surface that does not have a patterned image.

At 502, the method starts. At 504, a patterned image is prepared for etching. After the patterned image is developed, and the circuitry (for example, copper circuitry) is exposed, the patterned image is ready for processing through a low-surface-tension cleaner. At 506, the first stage of the microetch is performed in which the patterned image is processed through a low-surface-tension cleaner such as the cleaner described earlier (see, for example, Table 2). The cleaner can remove oxidation and provide a lower-surface-tension photoresist-to-metal interface. The lower-surface tension interface can inhibit outgassed hydrogen from adhering to the developed photoresist.

At 508, the patterned image is rinsed. At 510, the second stage of the microetch is performed in which the patterned image is immersed in a microetch formulation such as the formulation described earlier (see, for example, Table 3).

At 512, the patterned image is post-processed, and at 514, method 500 ends.

Hydrogen outgassing can occur as an oxidation reaction starts to remove metal (for example, copper) from the developed surface. A low-surface-tension surface between the micro-etch and the developed photoresist image can at least partially prevent hydrogen gas from adhering to the surface thereby allowing hydrogen gas to dissipate in the etch.

According to the present state of the art, a superconducting material may generally only act as a superconductor if it is cooled below a critical temperature that is characteristic of the specific material in question. For this reason, those of skill in the art will appreciate that a system that includes a superconducting device (e.g., a superconducting PCB fabricated using systems and methods of the present application) may include a system for cooling the superconducting materials in the superconducting device. Systems and methods for such cooling (e.g., a dilution refrigerator) are well known in the art.

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to multilayer superconducting PCB systems, methods and apparatus, not necessarily the exemplary multilayer superconducting PCB systems, methods, and apparatus generally described above.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, including but not limited to U.S. Provisional Patent Application Ser. No. 62/863,028, filed Jun. 18, 2019, entitled "SYSTEMS AND METHOD FOR ETCHING OF METALS", U.S. Provisional Patent Application Ser. No. 60/881,358, filed Jan. 18, 2007, entitled "INPUT/OUTPUT SYSTEMS AND DEVICES FOR USE WITH SUPERCONDUCTING BASED COMPUTING SYSTEMS", U.S. Pat. No. 8,441,329 entitled "INPUT/OUTPUT SYSTEMS AND DEVICES FOR USE WITH SUPERCONDUCTING BASED COMPUTING SYSTEMS", U.S. Pat. No. 8,008,991 entitled "SYSTEMS, METHODS AND APPARATUS FOR ELECTRICAL FILTERS", U.S. Provisional Patent Application Ser. No. 60/979,031, filed Oct. 10, 2007, entitled "SYSTEMS, METHODS AND APPARATUS FOR MULTILAYER SUPERCONDUCTING PRINTED CIRCUIT BOARDS", U.S. Pat. No. 8,315,678 entitled "SYSTEMS, METHODS, AND APPARATUS FOR MULTILAYER SUPERCONDUCTING PRINTED CIRCUIT BOARDS", U.S. Provisional Patent Application Ser. No. 62/431,333, filed Dec. 7, 2016, entitled "MULTILAYER SUPERCONDUCTING PRINTED CIRCUIT BOARD RELATED SYSTEMS, METHODS, AND APPARATUS" and International PCT Patent Application No. US2017/65152 (also published as International PCT Patent Publication No. WO2018106942A1) filed Dec. 7, 2017, entitled "MULTILAYER SUPERCONDUCTING PRINTED CIRCUIT BOARD RELATED SYSTEMS, METHODS, AND APPARATUS" are incorporated herein by reference, in their entirety. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of fabricating a multilayer superconducting printed circuit board, the method comprising:
   first, forming a bimetal foil to overlie a substrate, the bimetal foil comprising a first layer of a first metal, a layer of a second metal, and a second layer of the first metal; and
   applying a photoresist that defines a patterned image to be etched onto the second layer of the first metal;
   processing the second layer of the first metal to reduce surface tension after applying the photoresist; and
   etching the second layer of the first metal to etch the patterned image in the second layer of the first metal;
   wherein:
   etching the second layer of the first metal comprises immersing at least the second layer of the first metal and the photoresist in a microetch, the microetch releasing hydrogen gas during the etching; and processing the second layer of the first metal to reduce surface tension comprises immersing at least the second layer of the first metal and the photoresist in a surfactant, the surfactant impeding the released hydrogen gas from adhering to at least the second layer of the first metal.

2. The method of claim 1, wherein the etching the second layer of the first metal includes:
processing at least the second layer of the first metal and the photoresist through a cleaner;
rinsing at least the second layer of the first metal and the photoresist; and
then, immersing at least the second layer of the first metal and the photoresist in the microetch.

3. The method of claim 2, wherein the processing at least the second layer of the first metal and the photoresist through a cleaner includes processing at least the second layer of the first metal and the photoresist through the cleaner, the cleaner comprising the surfactant.

4. The method of claim 3, wherein the processing at least the second layer of the first metal and the photoresist through the cleaner includes processing at least the second layer of the first metal and the photoresist through the cleaner, the cleaner which further includes de-ionized water and sulfuric acid.

5. The method of claim 1, wherein the immersing at least the second layer of the first metal and the photoresist in a microetch includes immersing at least the second layer of the first metal and the photoresist in the microetch, the microetch which includes a catalyst and a first stabilizer.

6. The method of claim 5, wherein the immersing at least the second layer of the first metal and the photoresist in the microetch, the microetch which includes the catalyst and the first stabilizer includes immersing at least the second layer of the first metal and the photoresist in the microetch, the microetch which includes sodium molybdate and 1, 6 hexanediol.

7. The method of claim 1, wherein the immersing at least the second layer of the first metal and the photoresist in the microetch includes immersing at least the second layer of the first metal and the photoresist in the microetch, the microetch which further includes de-ionized water, sulfuric acid, hydrogen peroxide, and sodium hydroxybenzene sulfonate.

8. The method of claim 1, wherein the forming a bimetal foil to overlie a substrate includes forming the bimetal foil to overlie an electrically insulative substrate.

9. The method of claim 8, wherein the etching the second layer of the first metal includes:
processing at least the second layer of the first metal and the photoresist through a cleaner;
rinsing at least the second layer of the first metal and the photoresist; and,
after the processing at least the second layer of the first metal and the photoresist through a cleaner and the rinsing at least the second layer of the first metal and the photoresist, immersing at least the second layer of the first metal and the photoresist in the microetch.

10. The method of claim 8, wherein the forming the bimetal foil to overlie an electrically insulative substrate includes forming the bimetal foil to overlie at least one of a polyimide or a polytetrafluoroethylene (PTFE) composite.

11. The method of claim 1, wherein the forming a bimetal foil to overlie a substrate, the bimetal foil comprising a first layer of a first metal, a layer of a second metal, and a second layer of the first metal includes forming the bimetal foil to overlie the substrate, the bimetal foil comprising a first layer of a normal metal, a layer of a superconducting metal, and a second layer of the normal metal.

12. The method of claim 11, wherein the forming the bimetal foil to overlie the substrate, the bimetal foil comprising the first layer of the normal metal, the layer of the superconducting metal, and the second layer of the normal metal includes forming the bimetal foil to overlie the substrate, the bimetal foil comprising a first layer of copper, a layer of aluminum, and a second layer of copper.

13. The method of claim 12, wherein the forming the bimetal foil to overlie the substrate, the bimetal foil comprising the first layer of copper, the layer of aluminum, and the second layer of copper includes:
at least partially copper-plating the substrate to form a copper-plated substrate;
at least partially aluminum-plating the copper-plated substrate to form a superconductive substrate; and
at least partially copper-plating the superconductive substrate.

14. The method of claim 13, wherein the etching the second layer of the first metal includes:
processing at least the second layer of the first metal and the photoresist through a cleaner;
rinsing at least the second layer of the first metal and the photoresist; and
then, immersing at least the second layer of the first metal and the photoresist in a microetch.

15. The method of claim 1, wherein immersing at least the second layer of the first metal and the photo resist and immersing at least the second layer of the first metal and the photoresist in a microetch comprises immersing at least the second layer of the first metal and the photoresist in a microetch comprising the surfactant.

16. The method of claim 1, wherein processing the second layer of the first metal to reduce surface tension comprises pretreating at least the second layer of the first metal and the photoresist by immersing at least the second layer of the first metal and the photoresist in a pretreatment comprising the surfactant prior to etching the second layer of the first metal.

17. The method of claim 1, wherein immersing at least the second layer of the first metal and the photoresist in a surfactant comprises immersing at least the second layer of the first metal and the photoresist in a fluorosurfactant.

18. The method of claim 1, wherein immersing at least the second layer of the first metal and the photoresist in a surfactant comprises immersing at least the second layer of the first metal and the photoresist in a long-chain polymer.

19. The method of claim 1, wherein immersing at least the second layer of the first metal and the photoresist in a microetch comprises immersing at least the second layer of the first metal and the photoresist in a microetch comprising a catalyst, the catalyst comprising one of sodium tungstate and sodium molybdate.

20. The method of claim 1, wherein immersing at least the second layer of the first metal and the photoresist in a microetch comprises immersing at least the second layer of the first metal and the photoresist in a microetch comprising a first stabilizer and a second stabilizer, the first stabilizer comprising 1,6 hexanediol and the second stabilizer comprising sodium 4-hydroxybenzene sulfonate dihydrate.

* * * * *